United States Patent
Xu

(10) Patent No.: US 11,038,129 B1
(45) Date of Patent: Jun. 15, 2021

(54) METHOD OF MANUFACTURING A SUPPORT FILM AND FLEXIBLE ORGANIC LIGHT EMITTING DIODE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jie Xu, Wuhan (CN)

( * ) Notice: Subject to any disclaimer, the term of this patent is extended or adjusted under 35 U.S.C. 154(b) by 338 days.

(21) Appl. No.: 16/334,369

(22) PCT Filed: Oct. 12, 2018

(86) PCT No.: PCT/CN2018/109947
§ 371 (c)(1),
(2) Date: Mar. 19, 2019

(87) PCT Pub. No.: WO2019/237597
PCT Pub. Date: Dec. 19, 2019

(30) Foreign Application Priority Data

Jun. 14, 2018 (CN) .......................... 201810612783.7

(51) Int. Cl.
*H01L 51/00* (2006.01)
*H01L 51/56* (2006.01)
*H01L 27/32* (2006.01)

(52) U.S. Cl.
CPC ...... *H01L 51/0097* (2013.01); *H01L 27/3244* (2013.01); *H01L 51/56* (2013.01); *H01L 2251/5338* (2013.01)

(58) Field of Classification Search
None
See application file for complete search history.

(56) References Cited

U.S. PATENT DOCUMENTS 9,195,108 B2   11/2015   Park

FOREIGN PATENT DOCUMENTS

| CN | 102153342 A | 8/2011 |
|----|-------------|--------|
| CN | 102659400 A | 9/2012 |
| CN | 102153342 B * | 2/2013 |
| CN | 107068895 A | 8/2017 |

* cited by examiner

*Primary Examiner* — J. E. Schoenholtz

(57) ABSTRACT

A method of manufacturing a support film and a flexible organic light emitting diode (OLED) display device are provided. The support film includes a compound material having a chemical formula of $A_2Ti_2O_7$, where A is a positive trivalent element. The method includes pressing a dried compound material to obtain a sheet product, sintering the sheet product to obtain a sheet sample, and depositing the sheet sample using laser pulse deposition on a first protective film to obtain the support film. Material of the support film can be waterproof.

13 Claims, 2 Drawing Sheets

METHOD OF MANUFACTURING A SUPPORT FILM AND FLEXIBLE ORGANIC LIGHT EMITTING DIODE DISPLAY DEVICE

FIELD OF INVENTION

The present disclosure relates to the field of display technologies, and more particularly to a method of manufacturing a support film and a flexible organic light emitting diode (OLED) display device.

BACKGROUND OF INVENTION

With the development of the information society, organic light emitting diodes (OLEDs) are considered to be emerging application technologies for next-generation flat panel displays because the OLEDs have self-luminous light, no backlight, high contrast, thin thickness, wide viewing angle, fast response, flexible panels, wide temperature range of use, simple structures, and simple fabrication processes, etc.

Active matrix organic light emitting displays (AMOLEDs) have self-luminous characteristics and have superior contrast and viewing angle. However, OLEDs are also very susceptible to the ingress of water which may cause a failure thereof. Reliability of the products needs to be improved. For a flexible AMOLED, a backing material is attached to support a display module after a glass is peeled off. However, the backing material does not have waterproof performance and has a thick thickness, which cannot meet a thickness requirement of a flexible OLED product, and reliability thereof is poor.

SUMMARY OF INVENTION

An embodiment of the present disclosure provides a method of manufacturing a support film, a back plate, and a flexible organic light emitting diode (OLED) display device to solve technical problems that in the prior art, a support film attached to a flexible OLED display device to support a display module does not have waterproof performance and has a thick thickness, which cannot meet a thickness requirement of a flexible OLED product, and reliability thereof is poor.

An embodiment of the present disclosure provides a method of manufacturing a support film for a back plate of a flexible organic light emitting diode (OLED) display device. The support film includes a compound material having a chemical formula of $A_2Ti_2O_7$, where A is a positive trivalent element. The method includes a step S1 of obtaining a compound raw material of the compound material, a step S2 of ball milling the compound raw material within a set time, a step S3 of drying the compound material after the ball milling, a step S4 of pressing the dried compound material to obtain a sheet product, a step S5 of sintering the sheet product to obtain a sheet sample, and a step S6 of depositing the sheet sample using laser pulse deposition on a substrate to obtain the support film. A is one of a Bi element, a B element, and an Sb element, and the set time ranges between 7 hours and 9 hours.

In an embodiment of the present disclosure, in the step S4, a pressure of pressing the dried compound material to obtain the sheet product ranges between 2 MPa and 5 MPa, and a pressing time therefor is 10 minutes.

In an embodiment of the present disclosure, a pressure of pressing the dried compound material to obtain the sheet product ranges between 3 MPa and 4 MPa.

In an embodiment of the present disclosure, the step S5 includes providing a heating phase of linearly heating the sheet product at a rate of 5° C./min, up to 950° C., a constant-temperature heating phase of maintaining the sheet product at 950° C. for 9 hours, and a cooling phase of naturally cooling the sheet product.

An embodiment of the present disclosure provides another method of manufacturing a support film for a back plate of a flexible OLED display device. The support film includes a compound material having a chemical formula of $A_2Ti_2O_7$, where A is a positive trivalent element. The method includes a step S1 of obtaining a compound raw material of the compound material, a step S2 of ball milling the compound raw material within a set time, a step S3 of drying the compound material after the ball milling, a step S4 of pressing the dried compound material to obtain a sheet product, a step S5 of sintering the sheet product to obtain a sheet sample, and a step S6 of depositing the sheet sample using laser pulse deposition on a substrate to obtain the support film.

In an embodiment of the present disclosure, A is one of a Bi element, a B element, and an Sb element.

In an embodiment of the present disclosure, the set time ranges between 7 hours and 9 hours.

In an embodiment of the present disclosure, in the step S4, a pressure of pressing the dried compound material to obtain the sheet product ranges between 2 MPa and 5 MPa, and a pressing time therefor is 10 minutes.

In an embodiment of the present disclosure, a pressure of pressing the dried compound material to obtain the sheet product ranges between 3 MPa and 4 MPa.

In an embodiment of the present disclosure, the step S5 includes providing a heating phase of linearly heating the sheet product at a rate of 5° C./min, up to 950° C., a constant-temperature heating phase of maintaining the sheet product at 950° C. for 9 hours, and a cooling phase of naturally cooling the sheet product.

An embodiment of the present disclosure provides a back plate for a flexible OLED display device. The back plate includes a first protective film, a support film formed on the first protective film, and a second protective film disposed on the support film. The support film includes a compound material having a chemical formula of $A_2Ti_2O_7$, where A is a positive trivalent element. The support film is formed using the above-mentioned method of manufacturing the support film.

An embodiment of the present disclosure provides a flexible OLED display device. The flexible OLED display device includes a support film and an OLED display module disposed on the support film. The support film includes a compound material having a chemical formula of $A_2Ti_2O_7$, where A is a positive trivalent element.

In an embodiment of the present disclosure, a thickness of the support film is less than or equal to 10 micrometers.

In an embodiment of the present disclosure, the first protective film and the second protective film are both polyethylene terephthalate (PET) films.

In an embodiment of the present disclosure, a thickness of the support film is less than or equal to 10 micrometers.

In an embodiment of the present disclosure, A is one of a Bi element, a B element, and an Sb element.

Compared with a support film for a flexible OLED display device of the prior art, the embodiment of the present disclosure uses the compound material of $A_2Ti_2O_7$ as the material for the support film. Because the material for the support film has an octahedral structure, the densest packing can be formed, and a compactness of the supporting film is improved, thereby achieving the purpose of waterproofing. In addition, in the laser pulse method, the thickness of the support film can be adjusted using a deposition process, such that the thickness of the support film reaches 10 micrometers or even 10 micrometers or less to meet a thickness requirement of the support film of the OLED display device. Furthermore, because the support film is subjected to the sintering process, a support performance of the support film is improved to meet requirements of supporting a display module. The embodiment of the present disclosure can solve technical problems that in the prior art, the support film attached to the flexible OLED display device to support the display module does not have waterproof performance and has a thick thickness, which cannot meet a thickness requirement of a flexible OLED product, and reliability thereof is poor.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
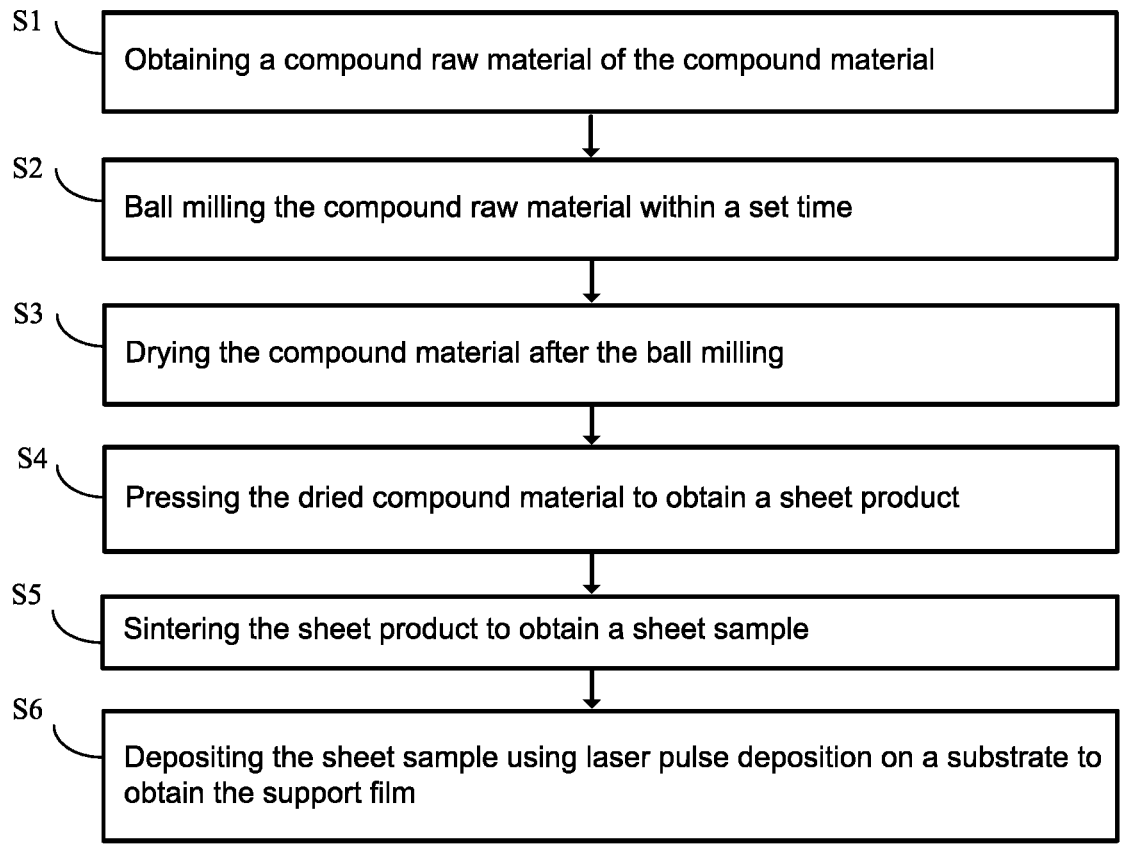
FIG. 1 is a flowchart of a method of manufacturing a support film according to an embodiment of the present disclosure.

The following description of the various embodiments is provided to illustrate the specific embodiments.

The embodiments described herein with reference to the accompanying drawings are explanatory, illustrative, and used to generally understand the present disclosure. Furthermore, directional terms described by the present disclosure, such as top, bottom, front, back, left, right, inner, outer, side, etc., are only directions by referring to the accompanying drawings, and thus the used terms are used only for describing embodiments of the present disclosure and are not intended to be limiting of the present disclosure.

In the drawings, same components are labeled with the same reference number. The following description is based on the specific embodiments of the present disclosure as illustrated and should not be construed as limiting the specific embodiments that are not described herein.

Referring to FIG. 1, a flowchart of a method of manufacturing a support film according to an embodiment of the present disclosure is provided. The embodiment of the present disclosure provides a method of manufacturing a support film for a back plate of a flexible organic light emitting diode (OLED) display device. The support film includes a compound material having a chemical formula of $A_2Ti_2O_7$, where A is a positive trivalent element. The method includes following steps:

Step S1 of obtaining a compound raw material of the compound material;

Step S2 of ball milling the compound raw material within a set time;

Step S3 of drying the compound material after the ball milling.

Step S4 of pressing the dried compound material to obtain a sheet product;

Step S5 of sintering the sheet product to obtain a sheet sample; and

Step S6 of depositing the sheet sample using laser pulse deposition on a substrate to obtain the support film.

In the embodiment, a series of compounds of $A_2Ti_2O_7$ has an octahedral structure to form the densest packing and achieve the purpose of waterproofing. In addition, A is one of Bi, B, and Sb. B is a boron element, Bi is a bismuth element, and Sb is an antimony element.

In the embodiment, in the step S2, the compound raw material is sufficiently ground in a ball mill to make a particle diameter of the compound raw material fine, so as to be able to be sufficiently pressed and sufficiently reacted in the subsequent steps. In the step S2, the set time ranges between 7 hours and 9 hours. Through 7-9 hours of the ball milling, the purpose of sufficient grinding can be achieved. The ball milling method in the embodiment is a wet ball milling. In the ball milling process, adding alcohol to destroy a surface energy between the ball milling materials, whereby bonding of the ball mill materials can be avoided. In addition, alcohol is easily volatilized and dried after the ball milling.

In the step S3, the ball-milled compound material is dried to obtain a pure compound material.

In step S4, the dried compound material is subjected to a pressing treatment by a pressing machine to obtain a sheet product. In the pressing process, a pressing pressure therefor ranges between 2 MPa and 5 MPa, and a pressing time therefor is 10 minutes. Further, the pressing is at a certain pressure value within the pressing pressure range, and the pressing time maintains for 10 minutes to obtain the sheet product having high stability.

In addition, in the pressing process, if the pressing pressure is too small, the density of the sheet product is too low, thereby causing the looseness of the sheet product, which is disadvantageous to improve the compactness. If the pressing pressure is too large, the density of the sheet product is too high, such that the sheet product is too rigid and not easily bent. Preferably, the pressing pressure is ranges between 3 MPa and 4 MPa.

In the step S5, the sheet product is sintered at a high temperature to improve the compactness, thereby improving the performance of supporting the OLED display module.

Figure 2:
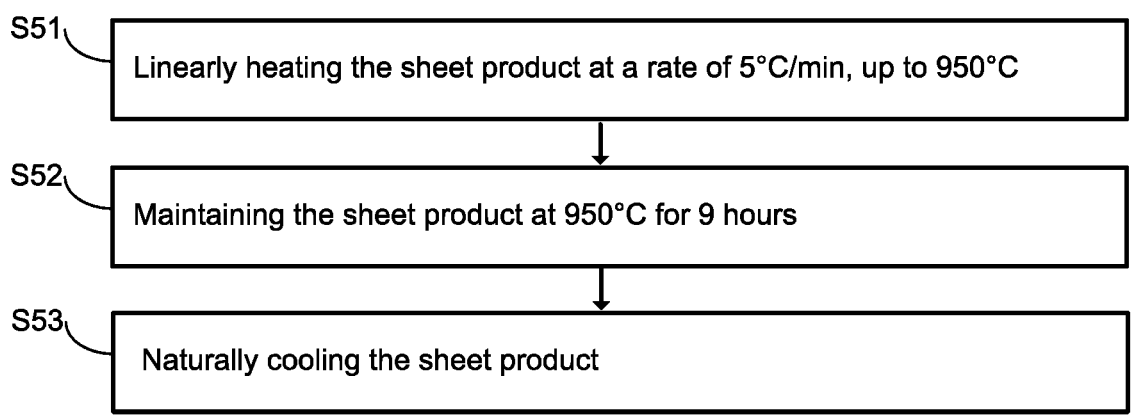
FIG. 2 is a flowchart of a method of manufacturing a support film in a step S according to the embodiment of the present disclosure.

Refer to FIG. 2, the step S5 includes following steps:

Step S51 of providing a heating phase of linearly heating the sheet product at a rate of 5° C./min, up to 950° C.;

Step S52 of providing a constant-temperature heating phase of maintaining the sheet product at 950° C. for 9 hours; and Step S53 of providing a cooling phase of naturally cooling the sheet product.

In the heating phase, the sintering temperature is gradually increased by linearly heating, such that the sheet product is gradually adapted to the temperature, and irregularity of temperature rise is avoided. The irregularity of temperature raise may result in cracks in the sheet product. When the temperature is increased at 950° C., the sheet product is maintained at 950° C. for 9 hours to ensure that the sheet product is sintered and formed. Finally, after the sheet product is sintered and formed, naturally cooling the sheet product is directly performed to obtain the sheet sample.

Further, the embodiment of the present disclosure is not limited to heating at a rate of 5° C./min in the heating phase, and is not limited to 950° C. in the constant-temperature heating phase, and the time is not limited to 9 hours.

In the step S6, because the sheet product is sintered, a ceramic structure is formed. Therefore, in the step S6, the laser pulse method is selected to form the support film. In addition, the laser pulse method has the following advantages. Firstly, it can grow multi-component films with same composition as a target, which even can include volatile multi-component films. Secondly, the laser energy is highly concentrated, which can evaporate inorganic substances such as ceramics. Thirdly, it can deposit high-quality nano-scale films because high particle kinetic energy can significantly enhance two-dimensional growth and inhibit three-dimensional growth, and promote film growth along two-dimensional development. Therefore, it is possible to obtain a very thin continuous film without being prone to islanding. In addition, extremely high energy and high chemical activity of laser pulse technologies contribute to the improvement of the film.

Therefore, the thickness of the support film can be adjusted in the deposition process using the laser pulse method to meet material requirements of the back plate regarding the waterproof capability.

In summary, the embodiment of the present disclosure uses the compound material of $A_2Ti_2O_7$ as the material for the support film. Because the material for the support film has an octahedral structure, the densest packing can be formed, and a compactness of the supporting film is improved, thereby achieving the purpose of waterproofing. In addition, in the laser pulse method, the thickness of the support film can be adjusted using a deposition process, such that the thickness of the support film reaches 10 micrometers or even is less than 10 micrometers meet a thickness requirement of the support film of the OLED display device. Furthermore, because the support film is subjected to the sintering process, a support performance of the support film is improved to meet requirements of supporting a display module.

Figure 3:
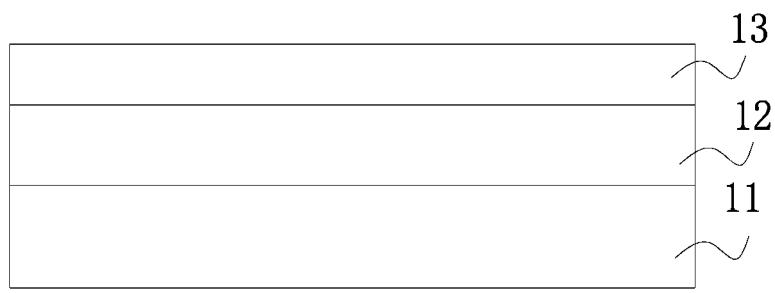
FIG. 3 is a schematic structural view of a back plate according to the embodiment of the present disclosure.

Referring to FIG. 3, a schematic structural view of a back plate according to the embodiment of the present disclosure is provided. The embodiment of the present disclosure provides a back plate for a flexible OLED display device. The back plate includes a first protective film 11, a support film 12, and a second protective film 13.

In details, the support film 12 is formed on the first protective film 11, and the second protective film 13 is disposed on the support film 12. The support film 12 includes a compound material having a chemical formula of $A_2Ti_2O_7$, where A is a positive trivalent element. The support film 12 is formed using the above-mentioned method of manufacturing the support film. The first protective film 11 of the embodiment corresponds to the substrate for the deposition process in the above embodiment.

Preferably, A is one of Bi, B, and Sb. B is a boron element, Bi is a bismuth element, and Sb is an antimony element.

In the embodiment, the thickness of the support film 12 is less than or equal to 10 micrometers to accommodate the OLED display device. The support film 12 is attached on a back surface of the display module to support the display module and provide waterproof performance. In the embodiment of present disclosure, the thickness of the support film 12 can be adjusted according to actual needs of the back plate, because in the embodiment of present disclosure, the thickness of the support film 12 is not limited thereto.

In the embodiment, the first protective film 11 and the second protective film 13 are both polyethylene terephthalate (PET) films. Moreover, a thickness of the first protective film 11 is greater than a thickness of the second protective film 13, whereby on one hand, the deposition of the support film 12 on the first protective film 11 is facilitated to process, and on another hand, a support performance of the first protective film 11 is improved.

When the embodiment is applied to an OLED display device, the first protective film 11 and the second protective film 13 need to be torn off.

The operation of the embodiment is that the support film 12 is deposited on the first protective film 11 with weak adhesion, and then the second protective film 13 is attached to the support film 12. This completes the formation of the back plate. The second protective film 13 may also be a polyethylene naphthalate (PEN) film, and the second protective film 13 functions to protect the support film 12.

Figure 4:
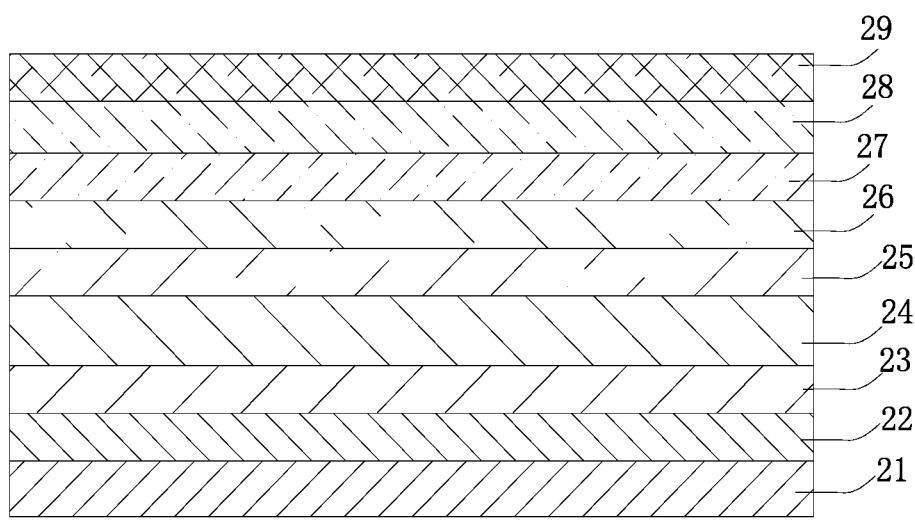
FIG. 4 is a schematic structural view of a flexible organic light emitting diode (OLED) display device according to the embodiment of the present disclosure.

Referring to FIG. 4, a schematic structural view of a flexible OLED display device according to the embodiment of the present disclosure is provided. The flexible OLED display device of the embodiment includes a support film 21 and an OLED display module disposed on the support film 21.

The OLED display module includes a substrate 22 disposed on the support film 21, an anode layer 23 disposed on the substrate 22, an organic light emitting layer 24 disposed on the anode layer 23, a negative electrode layer 25 disposed on the organic light emitting layer 24, an encapsulation layer 26 disposed on the negative electrode layer 25, a polarizer 27 disposed on the encapsulation layer 26, a touch screen 28 disposed on the polarizer 27, and a protective layer 29 disposed on the touch screen 28.

In addition, the structure of the support film 21 of the flexible OLED display device of the embodiment of the present disclosure is same as that of the support film in the embodiment of the back plate. For details, refer to the above disclosure of the embodiment, and details are not described herein again.

It is understood that, the OLED display module 22 can also be other structure. This is not limited to the embodiment of the present disclosure.

The bonding process of the embodiment is firstly tearing off the second protective film on the back plate, then attaching the supporting film 21 to the back surface of the OLED display module, and finally tearing off the first protective film to complete the bonding process.

Compared with a support film for a flexible OLED display device of the prior art, the embodiment of the present disclosure uses the compound material of $A_2Ti_2O_7$ as the material for the support film. Because the material for the support film has an octahedral structure, the densest packing can be formed, and a compactness of the supporting film is improved, thereby achieving the purpose of waterproofing. In addition, in the laser pulse method, the thickness of the support film can be adjusted using a deposition process, such that the thickness of the support film reaches 10 micrometers or even is less than 10 micrometers to meet a thickness requirement of the support film of the OLED display device. Furthermore, because the support film is subjected to the sintering process, a support performance of the support film is improved to meet requirements of supporting a display module. The embodiment of the present disclosure can solve technical problems that in the prior art, the support film attached to the flexible OLED display device to support the display module does not have waterproof performance and has a thick thickness, which cannot meet a thickness requirement of a flexible OLED product, and reliability thereof is poor.

The invention claimed is:

1. A method of manufacturing a support film for a back plate of a flexible organic light emitting diode (OLED) display device, wherein the support film comprises a compound material having a chemical formula of $A_2Ti_2O_7$, where A is a positive trivalent element, the method comprising:
   a step S1 of obtaining a compound raw material of the compound material;
   a step S2 of ball milling the compound raw material within a set time;
   a step S3 of drying the compound material after the ball milling;
   a step S4 of pressing the dried compound material to obtain a sheet product;
   a step S5 of sintering the sheet product to obtain a sheet sample; and
   a step S6 of depositing the sheet sample using laser pulse deposition on a substrate to obtain the support film;
   wherein A is one of a Bi element, a B element, and an Sb element, and the set time ranges between 7 hours and 9 hours.

2. The method according to claim 1, wherein in the step S4, a pressure of pressing the dried compound material to obtain the sheet product ranges between 2 MPa and 5 MPa, and a pressing time therefor is 10 minutes.

3. The method according to claim 2, wherein a pressure of pressing the dried compound material to obtain the sheet product ranges between 3 MPa and 4 MPa.

4. The method according to claim 1, wherein the step S5 comprises providing a heating phase of linearly heating the sheet product at a rate of 5° C./min, up to 950° C., a constant-temperature heating phase of maintaining the sheet product at 950° C. for 9 hours, and a cooling phase of naturally cooling the sheet product.

5. A method of manufacturing a support film for a back plate of a flexible organic light emitting diode (OLED) display device, wherein the support film comprises a compound material having a chemical formula of $A_2Ti_2O_7$, where A is a positive trivalent element, the method comprising:
   a step S1 of obtaining a compound raw material of the compound material;
   a step S2 of ball milling the compound raw material within a set time;
   a step S3 of drying the compound material after the ball milling;
   a step S4 of pressing the dried compound material to obtain a sheet product;
   a step S5 of sintering the sheet product to obtain a sheet sample; and
   a step S6 of depositing the sheet sample using laser pulse deposition on a substrate to obtain the support film.

6. The method according to claim 5, wherein A is one of a Bi element, a B element, and an Sb element.

7. The method according to claim 5, wherein the set time ranges between 7 hours and 9 hours.

8. The method according to claim 5, wherein in the step S4, a pressure of pressing the dried compound material to obtain the sheet product ranges between 2 MPa and 5 MPa, and a pressing time therefor is 10 minutes.

9. The method according to claim 8, wherein a pressure of pressing the dried compound material to obtain the sheet product ranges between 3 MPa and 4 MPa.

10. The method according to claim 5, wherein the step S5 comprises providing a heating phase of linearly heating the sheet product at a rate of 5° C./min, up to 950° C., a constant-temperature heating phase of maintaining the sheet product at 950° C. for 9 hours, and a cooling phase of naturally cooling the sheet product.

11. A flexible organic light emitting diode (OLED) display device, comprising:
    a support film; and
    an OLED display module disposed on the support film;
    wherein the support film comprises a compound material having a chemical formula of $A_2Ti_2O_7$, where A is a positive trivalent element.

12. The flexible OLED display device according to claim 11, wherein a thickness of the support film is less than or equal to 10 micrometers.

13. The flexible OLED display device according to claim 11, wherein A is one of a Bi element, a B element, and an Sb element.

* * * * *